US011757349B2

(12) United States Patent
Wang et al.

(10) Patent No.: US 11,757,349 B2
(45) Date of Patent: Sep. 12, 2023

(54) LIQUID COOLED CURRENT SENSOR ASSEMBLIES

(71) Applicant: FORD GLOBAL TECHNOLOGIES, LLC, Dearborn, MI (US)

(72) Inventors: Fan Wang, Novi, MI (US); Serdar Hakki Yonak, Ann Arbor, MI (US); Yantao Song, Northville, MI (US); Miao Wang, Westland, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 240 days.

(21) Appl. No.: 17/212,199

(22) Filed: Mar. 25, 2021

(65) Prior Publication Data

US 2022/0311325 A1 Sep. 29, 2022

(51) Int. Cl.
*H02M 1/32* (2007.01)
*H05K 7/20* (2006.01)
*H02K 11/33* (2016.01)
*H05K 7/14* (2006.01)
*H02M 7/00* (2006.01)

(52) U.S. Cl.
CPC .............. *H02M 1/32* (2013.01); *H02K 11/33* (2016.01); *H02M 7/003* (2013.01); *H05K 7/1432* (2013.01); *H05K 7/20927* (2013.01)

(58) Field of Classification Search
CPC ......... H02M 1/32; H02M 7/003; H02M 1/327
See application file for complete search history.

(56) References Cited

U.S. PATENT DOCUMENTS

| | | | |
|---|---|---|---|
| 9,350,228 B2 | 5/2016 | Uetake et al. | |
| 2020/0169147 A1* | 5/2020 | Söhnle | H02M 7/003 |
| 2020/0205319 A1* | 6/2020 | Pouilly | H05K 7/14329 |

FOREIGN PATENT DOCUMENTS

| | | |
|---|---|---|
| JP | 2015076933 A | 4/2015 |
| KR | 101865967 B1 | 6/2018 |

* cited by examiner

*Primary Examiner* — Adolf D Berhane
*Assistant Examiner* — Afework S Demisse
(74) *Attorney, Agent, or Firm* — David B. Kelley; Carlson, Gaskey & Olds, P.C.

(57) ABSTRACT

This disclosure is directed to power systems for transferring power between electrical components. An exemplary power system includes a first electrical component (e.g., an inverter system) having a current sensor assembly for detecting current flowing between the first electrical component and a second electrical component (e.g., an electric motor) in order to more reliably manage and control operation of the second electrical component. The current sensor assembly may include an integrated cooler that includes an internal cooling circuit configured to circulate coolant for cooling one or more bus bars of the current sensor assembly.

20 Claims, 5 Drawing Sheets

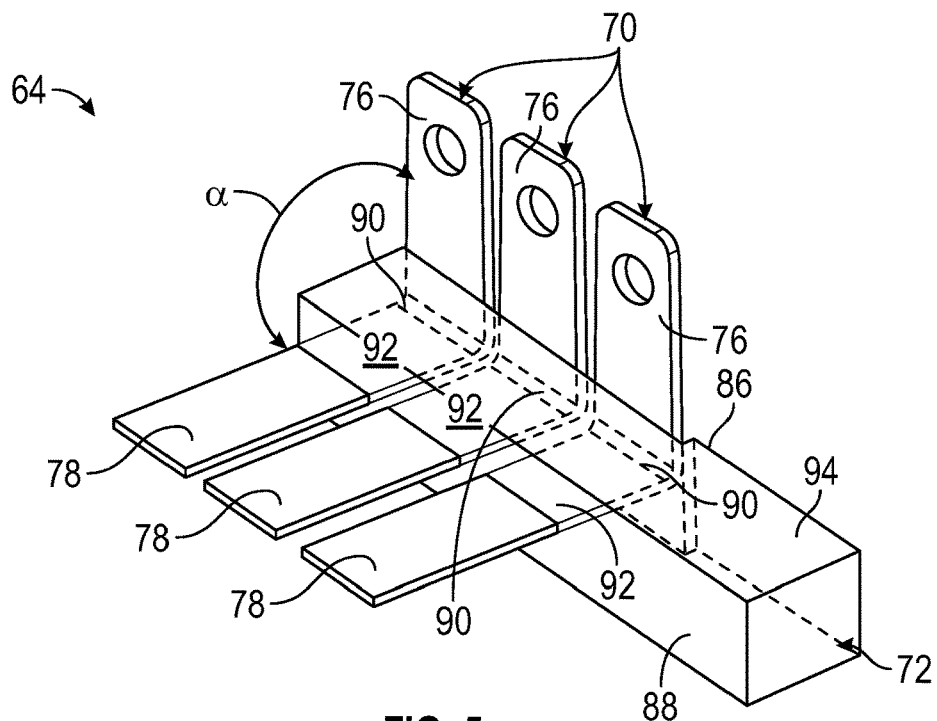
FIG. 5
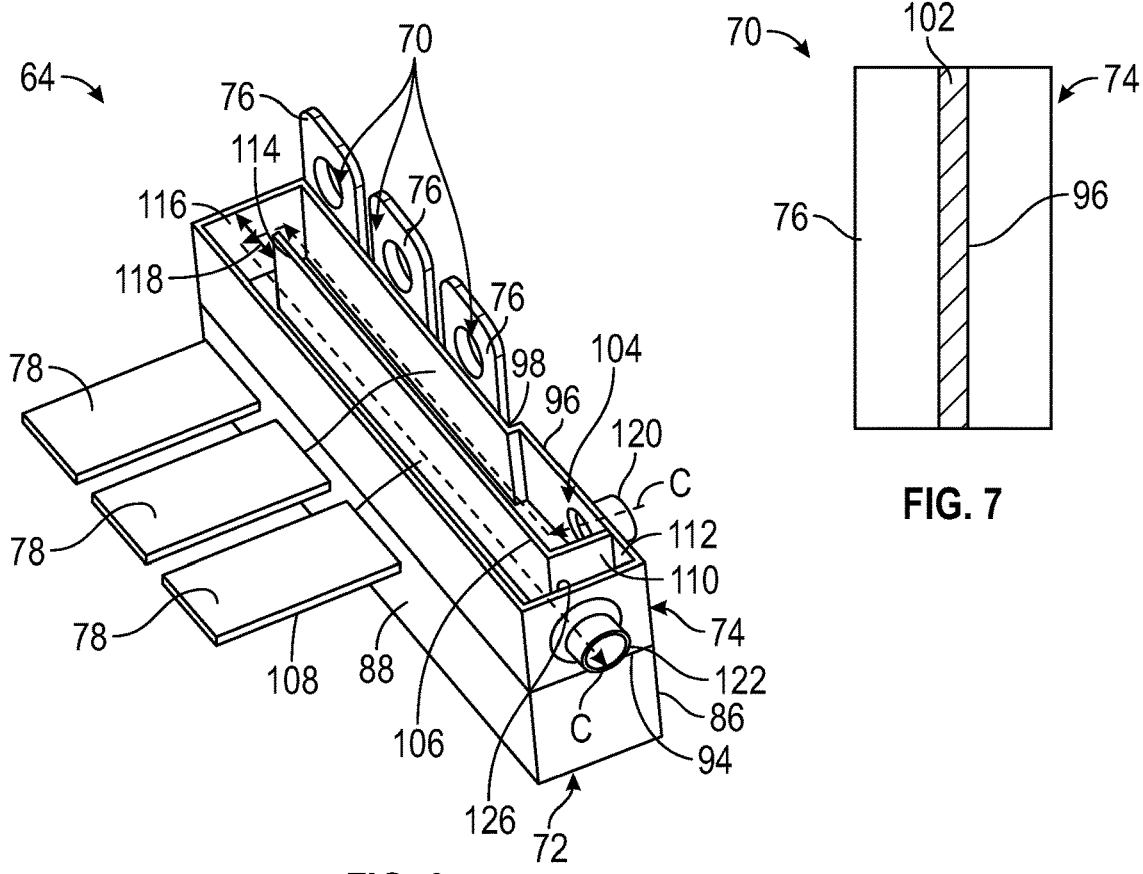
FIG. 6
FIG. 7

LIQUID COOLED CURRENT SENSOR ASSEMBLIES

TECHNICAL FIELD

This disclosure relates to power systems, and more particularly to power systems that include liquid cooled current sensor assemblies.

BACKGROUND

Electrified vehicles can be driven by one or more battery powered electric motors. Conventional motor vehicles, by contrast, rely exclusively on the internal combustion engine to propel the vehicle.

A high voltage battery pack typically powers the electric motor of electrified vehicles. An inverter system converts direct current (DC) power from the high voltage battery pack to alternating current (AC) power for powering the electric motor. The inverter system typically includes current sensors for detecting current flowing between the inverter system and the electric motor in order to more reliably manage and control operation of the electric motor.

SUMMARY

A power system according to an exemplary aspect of the present disclosure includes, among other things, a first electrical component, a second electrical component, and a current sensor assembly adapted to monitor a flow of current between the first electrical component and the second electrical component. The current sensor assembly includes a current sensor case, a bus bar extending through the current sensor case, a cooler positioned against the current sensor case, and a cooling circuit arranged inside the cooler and configured for circulating a coolant for cooling the bus bar.

In a further non-limiting embodiment of the foregoing power system, the first electrical component is an inverter system and the second electrical component is an electric motor.

In a further non-limiting embodiment of either of the foregoing power systems, the bus bar includes a first end portion that extends through a first side of the current sensor case and a second end portion that extends through a second side of the current sensor case.

In a further non-limiting embodiment of any of the forgoing power systems, the bus bar includes a mid-section that connects between the first end portion and the second end portion. The bus bar include a bend that positions the first end portion at an angle relative to the mid-section.

In a further non-limiting embodiment of any of the forgoing power systems, the angle is about 90 degrees.

In a further non-limiting embodiment of any of the forgoing power systems, the cooler is positioned against and interfaces relative to a top surface of the current sensor case.

In a further non-limiting embodiment of any of the forgoing power systems, a surface of the cooler includes an indentation sized to accommodate a first end portion of the bus bar that extends through the current sensor case.

In a further non-limiting embodiment of any of the forgoing power systems, a thermal interface material is disposed between the first end portion of the bus bar and the surface of the cooler.

In a further non-limiting embodiment of any of the forgoing power systems, the surface of the cooler is disposed between the first end portion of the bus bar and the cooling circuit.

In a further non-limiting embodiment of any of the forgoing power systems, the cooling circuit of the cooler includes an inlet port, a first cooling channel, a second cooling channel, and an outlet port.

In a further non-limiting embodiment of any of the forgoing power systems, a dividing wall is disposed between the first cooling channel and the second cooling channel.

In a further non-limiting embodiment of any of the forgoing power systems, multiple dividing walls are disposed between the first cooling channel and the second cooling channel.

In a further non-limiting embodiment of any of the forgoing power systems, the inlet port and the outlet port are located at opposite ends of the cooler.

In a further non-limiting embodiment of any of the forgoing power systems, the inlet port and the outlet port are located at adjoining walls of the cooler.

In a further non-limiting embodiment of any of the forgoing power systems, an electrified vehicle includes a power system having a first electrical component, a second electrical component, and a current sensor assembly adapted to monitor a flow of current between the first electrical component and the second electrical component. The current sensor assembly includes a current sensor case, a bus bar extending through the current sensor case, a cooler positioned against the current sensor case, and a cooling circuit arranged inside the cooler and configured for circulating a coolant for cooling the bus bar.

A method according to another exemplary aspect of the present disclosure includes, among other things, communicating a coolant through an inlet port of a cooler of a current sensor assembly, directing the coolant from the inlet port to a cooling circuit located inside the cooler, and circulating the coolant through the cooling circuit to remove heat from a bus bar of the current sensor assembly. The bus bar extends through a current sensor case that interfaces with the cooler.

In a further non-limiting embodiment of the foregoing method, the coolant includes oil or glycol.

In a further non-limiting embodiment of either of the foregoing methods, the method includes expelling the coolant from the cooling circuit through an outlet port of the cooler.

In a further non-limiting embodiment of any of the foregoing methods, the inlet port receives the coolant in series with a cooler of an inverter system.

In a further non-limiting embodiment of any of the foregoing methods, the inlet port receives the coolant in parallel with a cooler of an inverter system.

The embodiments, examples, and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

BRIEF DESCRIPTION OF THE DRAWINGS

FIG. 5 illustrates a current sensor case and bus bars of the current sensor assembly of FIGS. 3 and 4.

FIG. 6 is a partial cut-away view of the current sensor assembly of FIGS. 3, 4, and 5 and illustrates an internal cooling circuit of the current sensor assembly.

FIG. 7 is a cross-sectional view through section 7-7 of the current sensor assembly of FIG. 4.

DETAILED DESCRIPTION

This disclosure is directed to power systems for transferring power between electrical components. An exemplary power system includes a first electrical component (e.g., an inverter system) having a current sensor assembly for detecting current flowing between the first electrical component and a second electrical component (e.g., an electric motor) in order to more reliably manage and control operation of the second electrical component. The current sensor assembly may include an integrated cooler that includes an internal cooling circuit configured to circulate coolant for cooling one or more bus bars of the current sensor assembly. These and other features of this disclosure are described in greater detail below.

Figure 1:
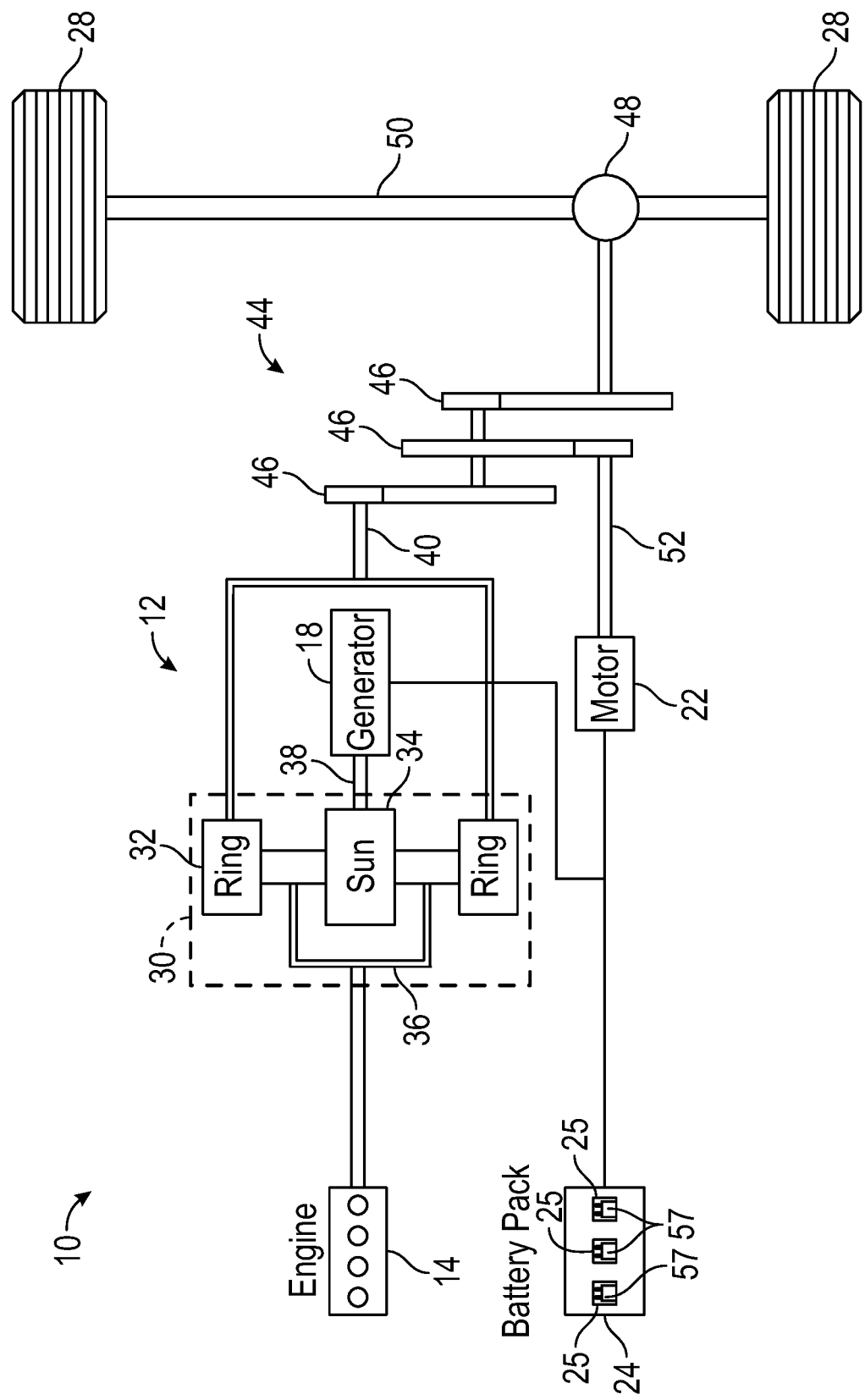
FIG. 1 schematically illustrates a powertrain of an electrified vehicle.

FIG. 1 schematically illustrates a powertrain 10 for an electrified vehicle 12. Although depicted as a hybrid electric vehicle (HEV), it should be understood that the concepts described herein are not limited to HEVs and could extend to other electrified vehicles, including, but not limited to, plug-in hybrid electric vehicles (PHEVs), battery electric vehicles (BEVs), fuel cell vehicles, etc.

In an embodiment, the powertrain 10 is a power-split powertrain system that employs first and second drive systems. The first drive system includes a combination of an engine 14 and a generator 18 (i.e., a first electric machine). The second drive system includes at least a motor 22 (i.e., a second electric machine), the generator 18, and a battery pack 24. In this example, the second drive system is considered an electric drive system of the powertrain 10. The first and second drive systems are each capable of generating torque to drive one or more sets of vehicle drive wheels 28 of the electrified vehicle 12. Although a power-split configuration is depicted in FIG. 1, this disclosure extends to any hybrid or electric vehicle including full hybrids, parallel hybrids, series hybrids, mild hybrids, or micro hybrids.

The engine 14, which may be an internal combustion engine, and the generator 18 may be connected through a power transfer unit 30, such as a planetary gear set. Of course, other types of power transfer units, including other gear sets and transmissions, may be used to connect the engine 14 to the generator 18. In an embodiment, the power transfer unit 30 is a planetary gear set that includes a ring gear 32, a sun gear 34, and a carrier assembly 36.

The generator 18 can be driven by the engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In an embodiment, the second power transfer unit 44 is mechanically coupled to an axle 50 through the differential 48 to distribute torque to the vehicle drive wheels 28.

The motor 22 can also be employed to drive the vehicle drive wheels 28 by outputting torque to a shaft 52 that is also connected to the second power transfer unit 44. In an embodiment, the motor 22 and the generator 18 cooperate as part of a regenerative braking system in which both the motor 22 and the generator 18 can be employed as generators to output electrical power. For example, the motor 22 and the generator 18 can each output electrical power to the battery pack 24.

The battery pack 24 is an exemplary electrified vehicle battery. The battery pack 24 may be a high voltage traction battery pack that includes a plurality of battery arrays 25 (i.e., battery assemblies or groupings of battery cells 57) capable of outputting electrical power to operate the motor 22, the generator 18, and/or other electrical loads of the electrified vehicle 12 for providing power to propel the vehicle drive wheels 28. Other types of energy storage devices and/or output devices could also be used to electrically power the electrified vehicle 12.

Figure 2:
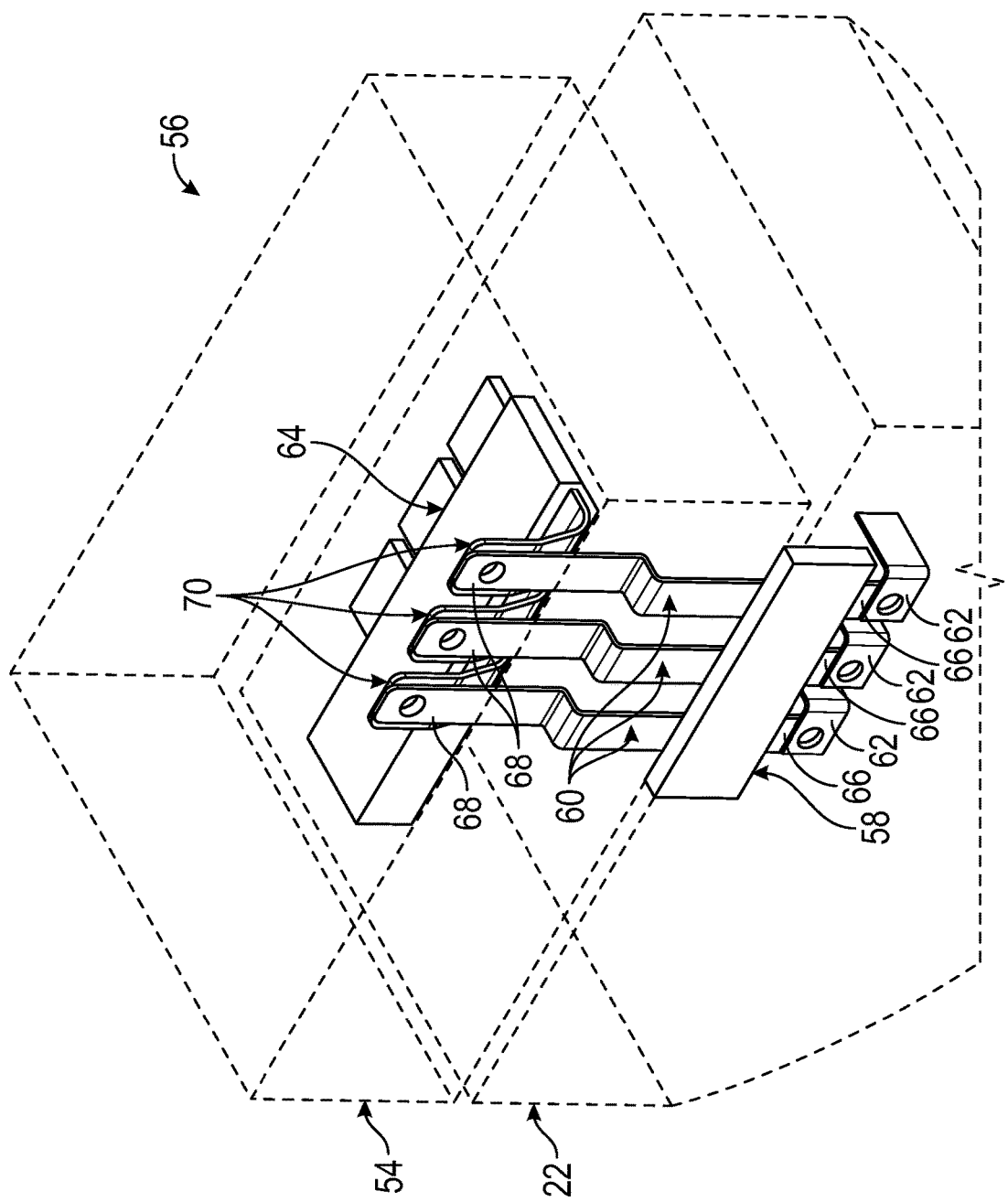
FIG. 2 illustrates a power system of an electrified vehicle.
Figure 3:
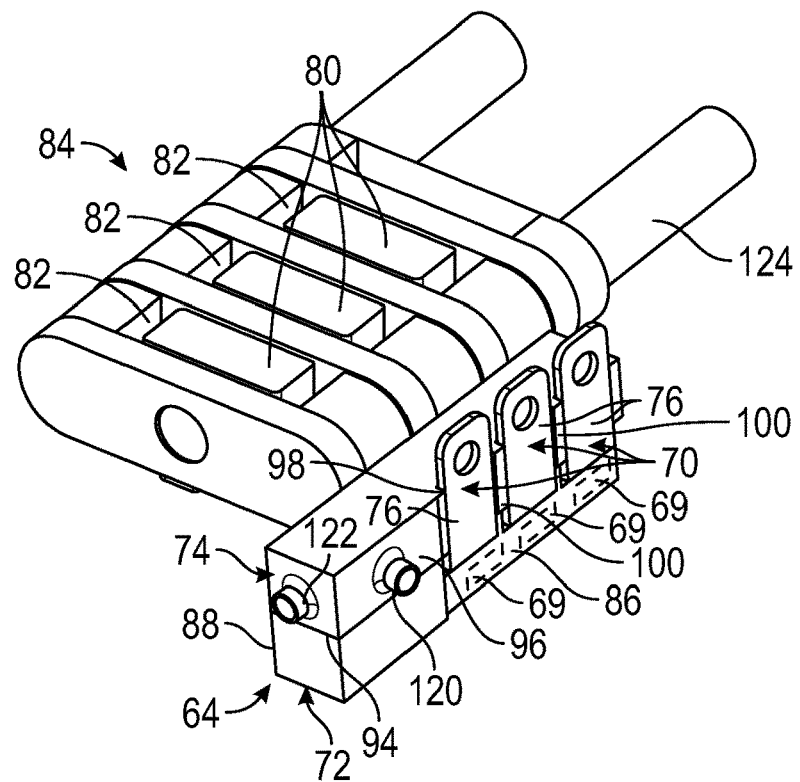
FIG. 3 illustrates select portions of an inverter system that includes an exemplary current sensor assembly.
Figure 4:
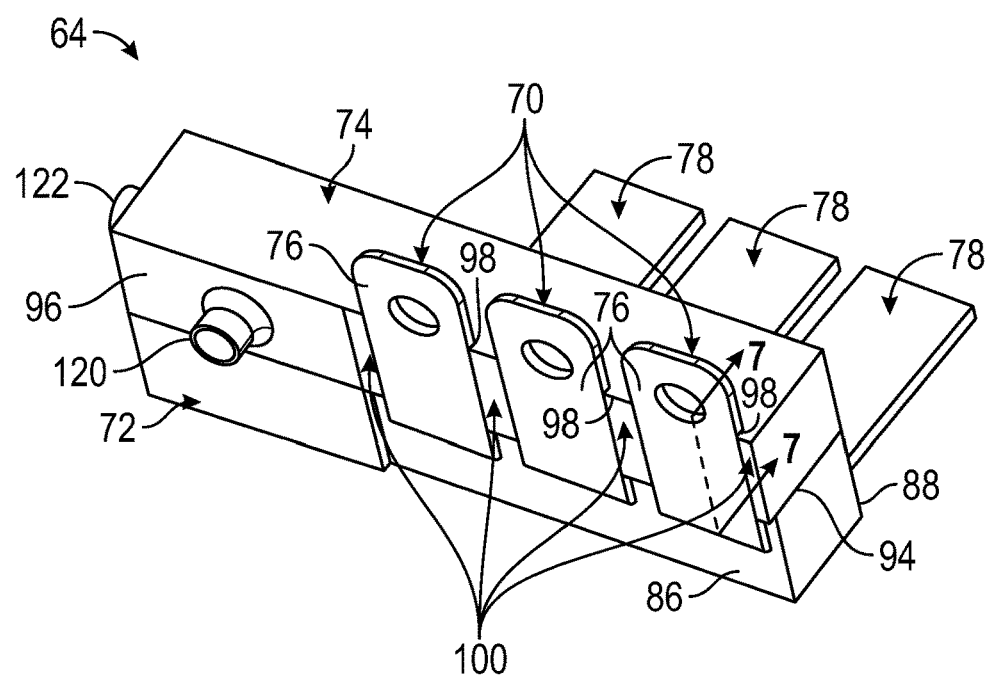
FIG. 4 illustrates the current sensor assembly of FIG. 3 when removed from the inverter system.

FIG. 2 schematically illustrates an exemplary power system 56. The power system 56 could be part of the powertrain 10 of the electrified vehicle 12 of FIG. 1, for example. However, the teachings of this disclosure may be applicable to any power system for any application.

In an embodiment, the power system 56 includes an inverter system 54 (i.e., a first electrical component), which is sometimes referred to as an inverter system controller (ISC), an electric motor 22 (i.e., a second electrical component), a terminal block assembly 58, and a current sensor assembly 64. Together, the terminal block assembly 58 and the current sensor assembly 64 may establish a connector assembly for electrically coupling the inverter system 54 and the electric motor 22. Although this disclosure describes electrically coupling an electric motor and an inverter system, the terminal block and current sensor assemblies of this disclosure could be used to electrically couple any electrical components that operate over an alternating current bus within a power system.

The terminal block assembly 58 may electrically couple the electric motor 22 to the inverter system 54 in order to output AC power for powering the electric motor 22. For example, the inverter system 54 may receive DC power from a battery pack or some other high voltage power source and may convert the DC power to three-phase AC power. The AC power is carried to the electric motor 22 by the terminal block assembly 58 for powering the electric motor 22.

The terminal block assembly 58 may include a plurality of bus bars 60 for electrically connecting the inverter system 54 and the electric motor 22. In the illustrated embodiment, the inverter system 54 is configured to provide a three-phase output to the electric motor 22, and thus the terminal block assembly 58 includes a total of three bus bars 60. However, the total number of bus bars 60 is not intended to limit this disclosure, and a greater or fewer number of bus bars than are shown in the figures associated with this disclosure could be employed within the terminal block assembly 58.

The current sensor assembly 64 is configured for detecting current flowing between the inverter system 54 and the electric motor 22 in order to more reliably manage and control operation of the electric motor 22. The current sensor assembly 64 may include a plurality of bus bars 70. Like the terminal block assembly 58, the current sensor assembly 64 may include a total of three bus bars 70. However, the total number of bus bars 70 is not intended to limit this disclosure.

Motor stator leads 62, which are connected to windings of a motor stator of the electric motor 22, are connected to first end portions 66 of the bus bars 60 of the terminal block assembly 58, and second, opposite end portions 68 of the bus bars 60 are connected to the bus bars 70 of the current sensor assembly 64. Opposite ends of the bus bars 70 of the current sensor assembly 64 may operably connect to power module cards of the inverter system 54.

In an embodiment, the bus bars 60, 70 are made of a metallic material, such as copper, for example. However, other metallic materials may also be suitable and are thus also contemplated within the scope of this disclosure.

The bus bars 70 of the current sensor assembly 64 may be required to carry high powered currents during some vehicle conditions. The thermal performance of the current sensor assembly 64 can limit the currently carrying performance of the inverter system 54. It is therefore desirable to actively cool the bus bars 70 of the current sensor assembly 64. This disclosure thus describes liquid cooled current sensor assemblies that are capable of actively managing the heat generated by the bus bars 70 during high power, high current operation of the power system 56.

FIGS. 3, 4, 5, and 6 illustrate an exemplary current sensor assembly 64 for use within a power system, such as the power system 56 of FIG. 2. The current sensor assembly 64 may include a current sensor case 72, the bus bars 70, and a cooler 74.

A plurality of current sensors 69 (schematically shown in FIG. 3) may be housed within the current sensor case 72. In an embodiment, one current sensor 69 is provided for each bus bar 70. The current sensors 69 are configured to monitor a flow of current through the bus bars 70. The current sensors 69 may generate control signals that are provided to a controller of the inverter system 54 for regulating the power provided to the electric motor 22.

The bus bars 70 may extend through the current sensor case 72. First end portions 76 of the bus bars 70 may extend outside of the current sensor case 72 for connection to the bus bars 60 of the terminal block assembly 58, and second end portions 78 of the bus bars 70 may extend outside of the current sensor case 72 for connection to power module cards 80 of the inverter system 54. The power module cards 80 may be positioned within slots 82 of a cooler 84 of the inverter system 54 (see FIG. 3).

In an embodiment, the first end portions 76 of the bus bars 70 extend upwardly relative to a first side 86 of the current sensor case 72, and the second portion portions 78 extend laterally away from a second side 88 of the current sensor case 72. The second side 88 may be an opposite side of the current sensor case 72 from the first side 86. The first side 86 and the second side 88 are generally longitudinally extending sides of the current sensor case 88.

In another embodiment, each bus bar 70 includes a bend 90 (best shown in FIG. 5) that positions the first end portions 76 at an angle α relative to mid-sections 92 of the bus bars 70 that connect between the first and second end portions 76, 78. The bend 90 may be a 90 degree bend, in an embodiment. However, other configurations are also contemplated. The bus bars 70 may be arranged such that the bends 90 are positioned outside of the current sensor case 72 when the bus bars 70 are positioned therein.

The cooler 74 may be positioned against a top surface 94 of the current sensor case 72. The cooler 74 and the current sensor case 72 may thus share a common interface between the two components.

The cooler 74 may be integrated together with the current sensor case 72. In an embodiment, the current sensor case 72 and the cooler 74 are made of the same polymeric material. In such an embodiment, the current sensor case 72 and the cooler 74 may be integrated together via an injection molding process or any other suitable manufacturing process.

In another embodiment, the current sensor case 72 may be constructed of a polymeric material and the cooler 74 may be constructed of a metallic material. In such an embodiment, the cooler 74 may be integrated with the current sensor case 72 via an ultrasonic welding process or any other suitable welding process.

A surface 96 of the cooler 74 that extends above the first side 86 of the current sensor case 72 may include indentations 98 for accommodating the first end portions 76 of the bus bars 70. Each indentation 98 is configured to receive one of the bus bars 70. A trim section 100 of the surface 96 may extend between adjacent indentations 98. By virtue of the indentations 98 and the trim sections 100, the surface 96 is configured to support the first end portions 76 of the bus bars 70 against bending deformation during assembly.

As best illustrated in FIG. 6, a cooling circuit 104 may be provided inside the cooler 74. A dividing plate 106 may be positioned within an interior of the cooler 74 for establishing two or more interconnected cooling channels 108 of the cooler 74. In an embodiment, the dividing plate 106 is L-shaped and includes a first end portion 110 that connects to an interior wall 112 of the cooler 74 and a second end portion 114 that is spaced apart from another interior wall 116 of the cooler 74. A gap 118 thus extends between the interior wall 116 and the second end portion 114 of the dividing plate 106 to allow fluid to flow from one cooling channel 108 to another.

An inlet port 120 of the cooler 74 is configured to receive and direct a coolant C (e.g., oil, glycol, etc.) into the cooling circuit 104. As the coolant C circulates through the cooling channels 108, the coolant C picks up and takes away heat from the bus bars 70, which are in direct contact with the cooler 74 at the indentations 98 and the bottom surface of the cooler 74, thereby ensuring high cooling performance during high power, high current operation of the power system 56.

In an embodiment, a thermal interface material 102 may be disposed at the interface between the first end portions 76 of the bus bars 70 and the surface 96 of the cooler 74 against which the first end portions 76 are received (see, e.g., FIG. 7). The thermal interface material 102 may include an epoxy resin, a silicone based material, a thermal grease, etc. and is designed to increase the thermal conductivity between the bus bars 70 and the surface 96 that overlies the cooling circuit 104.

In an embodiment, the cooling circuit 104 of the cooler 74 may receive the coolant C in series with the cooler 84 of the inverter system 54. In such an embodiment, the coolant C exiting an outlet port 124 (see FIG. 3) of the cooler 84 may be delivered to the inlet port 120 of the cooler 74. In another embodiment, the cooling circuit 104 of the cooler 74 may receive the coolant C in parallel with the cooler 84 of the inverter system 54. In either case, the cooler 74 of the current sensor assembly 64 and the cooler 84 of the inverter system 54 may be part of a closed thermal loop that is arranged to circulate the coolant C through both the cooler 74 and the cooler 84 for actively cooling various components of the power system 56.

The coolant C may exit the cooling channels 108 of the cooling circuit 104 through an outlet port 122 of the cooler 74. In an embodiment, the outlet port 122 interfaces with an interior wall 126 that is opposite from the interior wall 116. However, other configurations are also contemplated within the scope of this disclosure.

Figure 8:
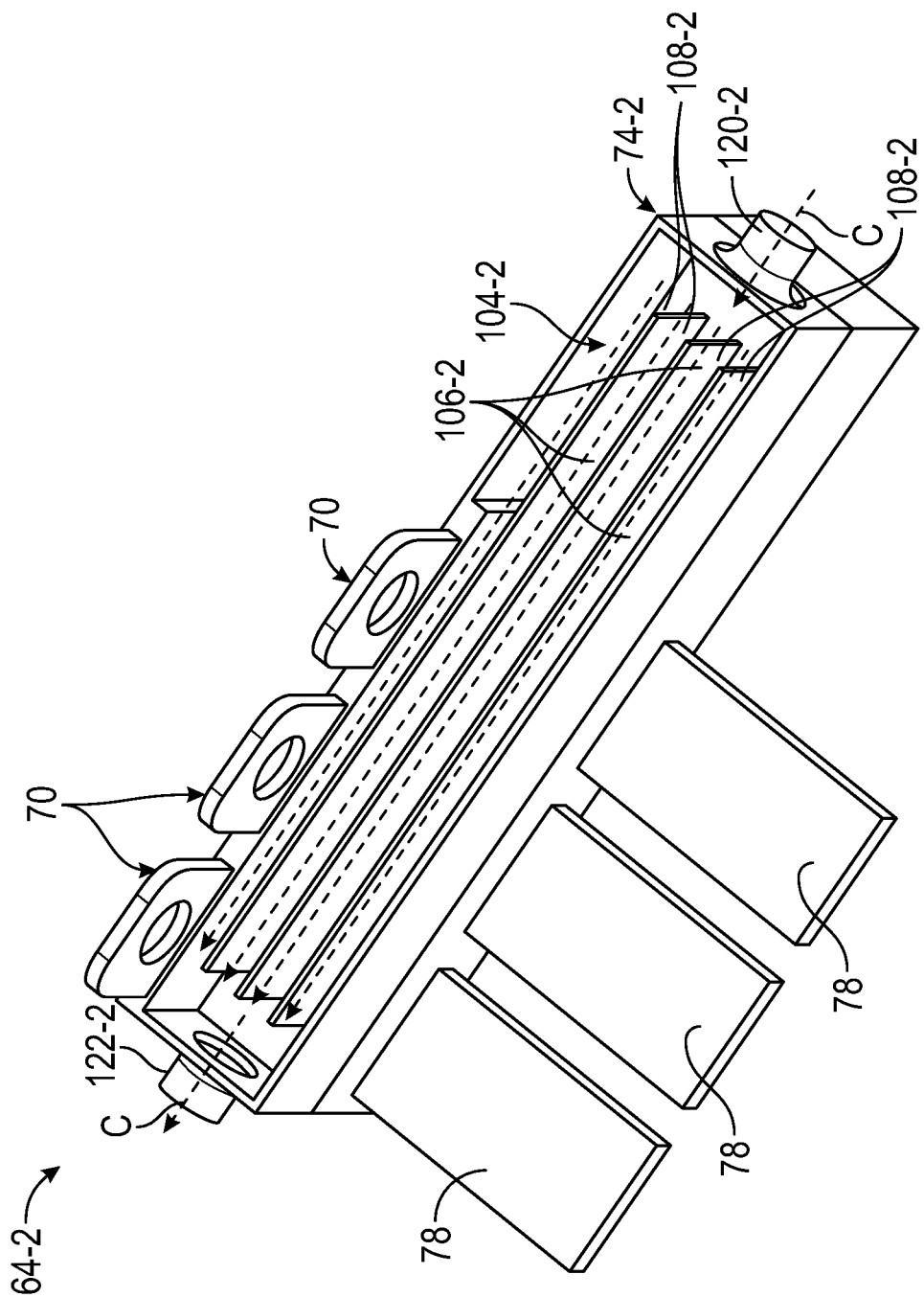
FIG. 8 illustrates an internal cooling circuit of another exemplary current sensor assembly.

FIG. 8 illustrates another exemplary current sensor assembly 64-2. The current sensor assembly 64-2 is similar to the current sensor assembly 64 described above and illustrated in FIGS. 3-7. However, in this embodiment, the current sensor assembly 64-2 includes a cooler 74-2 having a cooling circuit 104-2 that is a slightly modified version of the cooling circuit 104 of the cooler 74 of the current sensor assembly 64 described above.

For example, the cooling circuit 104-2 of the cooler 74-2 may include a plurality of dividing plates 106-2 that are positioned within an interior of the cooler 74-2 for establishing a multitude of interconnected cooling channels 108-2 of the cooler 74-2. Each of the dividing plates 106-2 may be a linear plate that excludes any bends. In addition, in this embodiment, an inlet port 120-2 and an outlet port 122-2 of the cooling circuit 104-2 may be disposed at opposite ends of the cooler 74-2.

The current sensor assemblies of this disclosure provide efficient and cost effective cooling of bus bars by using direct liquid cooling schemes. The active cooling schemes significantly improve the thermal performance of the bus bars and therefore enhance their current carrying capabilities, thereby improving the overall reliability and durability of the inverter system. Further, the proposed current sensor assembly designs promote a more compact design that is lightweight and cost effective to manufacture.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A power system, comprising:
a first electrical component;
a second electrical component;
a current sensor assembly adapted to monitor a flow of current between the first electrical component and the second electrical component,
wherein the current sensor assembly includes a current sensor case, a bus bar extending through the current sensor case, a cooler positioned against the current sensor case, and a cooling circuit arranged inside the cooler and configured for circulating a coolant for cooling the bus bar,
wherein a first end portion of the bus bar is connected to a second bus bar of a terminal block assembly that is connected to the second electrical component, and a second end portion of the bus bar is connected to a power module card of the first electrical component.

2. The power system as recited in claim 1, wherein the first electrical component is an inverter system and the second electrical component is an electric motor.

3. The power system as recited in claim 1, wherein the first end portion of the bus bar extends through a first side of the current sensor case and the second end portion extends through a second side of the current sensor case.

4. The power system as recited in claim 3, wherein the bus bar includes a mid-section that connects between the first end portion and the second end portion, and the bus bar further comprises a bend that positions the first end portion at an angle relative to the mid-section, and further wherein the angle is about 90 degrees.

5. The power system as recited in claim 1, wherein the cooler is positioned against and interfaces relative to a top surface of the current sensor case.

6. The power system as recited in claim 1, wherein a surface of the cooler includes an indentation sized to accommodate a first end portion of the bus bar that extends through the current sensor case, and further wherein the surface of the cooler is disposed between the first end portion of the bus bar and the cooling circuit.

7. The power system as recited in claim 6, comprising a thermal interface material disposed between the first end portion of the bus bar and the surface of the cooler.

8. The power system as recited in claim 1, wherein the cooling circuit of the cooler includes an inlet port, a first cooling channel, a second cooling channel, and an outlet port.

9. The power system as recited in claim 8, comprising a dividing wall disposed between the first cooling channel and the second cooling channel.

10. The power system as recited in claim 8, comprising multiple dividing walls disposed between the first cooling channel and the second cooling channel.

11. The power system as recited in claim 8, wherein the inlet port and the outlet port are located at opposite ends of the cooler or are located at adjoining walls of the cooler.

12. An electrified vehicle comprising the power system of claim 1.

13. The power system as recited in claim 1, wherein the second bus bar of the terminal block assembly that is connected to a motor stator lead of the second electrical component.

14. The power system as recited in claim 1, wherein the cooler and the current sensor case are integrated together to establish an integrated assembly made of a polymeric material.

15. A method, comprising:
communicating a coolant through an inlet port of a cooler of a current sensor assembly;
directing the coolant from the inlet port to a cooling circuit located inside the cooler,
wherein the cooling circuit includes a first cooling channel, a second cooling channel, and a dividing wall disposed between the first cooling channel and the second cooling channel; and circulating the coolant through the cooling circuit to remove heat from a bus bar of the current sensor assembly, wherein the bus bar extends through a current sensor case that interfaces with the cooler.

16. The method as recited in claim 15, wherein the coolant includes oil or glycol.

17. The method as recited in claim 15, comprising:

expelling the coolant from the cooling circuit through an outlet port of the cooler.

18. The method as recited in claim 15, wherein the inlet port receives the coolant in series with a cooler of an inverter system.

19. The method as recited in claim 15, wherein the inlet port receives the coolant in parallel with a cooler of an inverter system.

20. The method as recited in claim 15, wherein the inlet port receives the coolant in series or in parallel with a cooler of an inverter system, wherein the cooler of the current sensor assembly and the cooler of the inverter system are part of a closed thermal loop that is arranged to circulate the coolant through both the cooler of the current sensor assembly and the cooler of the inverter system.

* * * * *